US012772516B2

(12) United States Patent
Arango et al.

(10) Patent No.: US 12,772,516 B2
(45) Date of Patent: Oct. 20, 2026

(54) POWER SEMICONDUCTOR DEVICE

(71) Applicant: Hitachi Energy Ltd, Zürich (CH)

(72) Inventors: Yulieth Arango, Zürich (CH); Gianpaolo Romano, Baden (CH); Andrei Mihaila, Rieden (CH); Marco Bellini, Zürich (CH); Lars Knoll, Hägglingen (CH)

(73) Assignee: Hitachi Energy Switzerland AG, Baden (CH)

(*) Notice: Subject to any disclaimer, the term of this patent is extended or adjusted under 35 U.S.C. 154(b) by 355 days.

(21) Appl. No.: 18/550,219

(22) PCT Filed: Mar. 22, 2022

(86) PCT No.: PCT/EP2022/057471
§ 371 (c)(1),
(2) Date: Sep. 12, 2023

(87) PCT Pub. No.: WO2022/200338
PCT Pub. Date: Aug. 29, 2022

(65) Prior Publication Data

US 2024/0186377 A1 Jun. 6, 2024

(30) Foreign Application Priority Data

Mar. 22, 2021 (EP) .................................... 21163959

(51) Int. Cl.
*H10D 62/10* (2025.01)
*H10D 12/00* (2025.01)
(Continued)

(52) U.S. Cl.
CPC ......... *H10D 62/127* (2025.01); *H10D 12/481* (2025.01); *H10D 30/668* (2025.01);
(Continued)

(58) Field of Classification Search
CPC .. H10D 62/127; H10D 12/481; H10D 30/668; H10D 62/109; H10D 62/405;
(Continued)

(56) References Cited

U.S. PATENT DOCUMENTS 6,060,747 A 5/2000 Okumura et al.
10,014,376 B2 7/2018 Masuda et al.
(Continued)

FOREIGN PATENT DOCUMENTS

EP 2750198 A1 7/2014
JP H09260650 A 10/1997
(Continued)

OTHER PUBLICATIONS

Ebihara, Y., et al., “Deep-P Encapsulated 4H—SiC Trench MOSFETs With Ultra Low RonQgd,” Proceedings of the 30th International Symposium on Power Semiconductor Devices & ICs, May 13-17, 2018, 4 pages.
(Continued)

*Primary Examiner* — Mohammad M Hoque
(74) *Attorney, Agent, or Firm* — Slater Matsil, LLP

(57) ABSTRACT

One embodiment provides a power semiconductor device that includes a semiconductor body. A source region of a first conductivity type is disposed at a top side the semiconductor body. A channel region of a second conductivity type is disposed in the semiconductor body below the source region and a drift region of the first conductivity type is disposed in the semiconductor body below the channel region. A trench extends from the top side through the source region and through the channel region and ending in the drift region. As seen in a top view of the top side, the trench comprises a plurality of branch-offs. A gate electrode is disposed within
(Continued)

the trench and a shield region of the second conductivity type is located at least partially below a branch-off of the trench.

20 Claims, 10 Drawing Sheets

(51) Int. Cl.
*H10D 30/66* (2025.01)
*H10D 62/40* (2025.01)
*H10D 62/832* (2025.01)

(52) U.S. Cl.
CPC ......... *H10D 62/109* (2025.01); *H10D 62/405* (2025.01); *H10D 62/8325* (2025.01)

(58) Field of Classification Search
CPC ............. H10D 62/8325; H10D 64/513; H10D 62/107; H10D 64/519
USPC ............................................................ 257/77
See application file for complete search history.

(56) References Cited

U.S. PATENT DOCUMENTS

| | | | | |
|---|---|---|---|---|
| 2004/0195618 | A1* | 10/2004 | Saito | H10D 62/393 257/E29.066 |
| 2007/0040213 | A1* | 2/2007 | Hotta | H10D 30/668 257/E29.066 |
| 2013/0062629 | A1 | 3/2013 | Hiyoshi et al. | |
| 2013/0065384 | A1 | 3/2013 | Hiyoshi et al. | |
| 2013/0313635 | A1* | 11/2013 | Nakano | H10D 62/107 257/330 |
| 2016/0181365 | A1 | 6/2016 | Bolotnikov et al. | |
| 2016/0260798 | A1* | 9/2016 | Rupp | H10D 12/038 |
| 2016/0359026 | A1 | 12/2016 | Matsuura | |
| 2018/0240906 | A1* | 8/2018 | Tsujimura | H10D 30/668 |
| 2021/0135002 | A1 | 5/2021 | Sugawara et al. | |
| 2023/0055891 | A1* | 2/2023 | Blank | H10D 64/117 |

FOREIGN PATENT DOCUMENTS

| | | | | |
|---|---|---|---|---|
| JP | H11111976 | A | 4/1999 | |
| JP | 3329707 | B2 | 9/2002 | |
| JP | 2005150246 | A | 6/2005 | |
| JP | 2015173290 | A | 10/2015 | |
| JP | 2016163048 | A | 9/2016 | |
| JP | 2016225566 | A | 12/2016 | |
| JP | 2018133528 | A | 8/2018 | |
| WO | 2005048352 | A1 | 5/2005 | |
| WO | 2012105609 | A1 | 8/2012 | |
| WO | 2013031172 | A1 | 3/2013 | |
| WO | 2018163286 | A1 | 9/2018 | |
| WO | WO-2020135378 | A1 * | 7/2020 | H10D 64/519 |

OTHER PUBLICATIONS

Kobayashi, Y, et al., "3.3 kV-class 4H—SiC UMOSFET by Double-trench with Tilt Angle Ion Implementation," Materials Science Forum, ISSN: 1662-9752, vol. 858, May 24, 2016, 4 pages.
Liu, G., "Silicon carbide: A unique platform for metal-oxide-semiconductor physics," Applied Physics Reviews, vol. 2, Issue 2, Jun. 2015, 23 pages.
Qingwen, S., et al., "Investigation of SiC Trench MOSFET with Floating Islands," IET Power Electronics, vol. 9, Issue 13, Oct. 1, 2016, 8 pages.
Saxena, R., et al., "Trench Gate Power MOSFET: Recent Advances and Innovations," Advances in Microelectronics and Photonics, Chapter 1, Nova Science Publishers, Inc., Aug. 2012, 27 pages.
Tega, N., et al., "Robustness Improvement of Short-circuit Capability by SiC Trench-etched Double-diffused MOS (TED MOS)," Proceedings of the 30th International Symposium on Power Semiconductor Devices & ICs, Chicago, Il, USA, May 13-17, 2018, 4 pages.
Udrea, F., et al., "Superjunction Power Devices, History, Development, and Future Prospects," IEEE Transactions on Electron Devices, vol. 64, No. 3, Mar. 2017, 15 pages.
Williams, R., et al., "The Trench Power MOSFET: Part I—History, Technology, and Prospects," IEEE Transactions on Electron Devices, vol. 64, No. 3, Mar. 2017, 18 pages.

* cited by examiner

POWER SEMICONDUCTOR DEVICE

CROSS-REFERENCE TO RELATED APPLICATIONS

This application is a National Stage Filing under Section 371 of PCT/EP2022/057471, filed on Mar. 22, 2022, which claims the benefit of European Application No. 21163959.6, filed on Mar. 22, 2021, which applications are hereby incorporated herein by reference.

TECHNICAL FIELD

A power semiconductor device is provided.

BACKGROUND

Documents U.S. Pat. No. 10,014,376 B2, US 2013/0062629A1 and US 2013/0065384 A1 refer to the manufacture of SiC power devices.

Documents US 2016/0260798 A1, U.S. Pat. No. 6,060,747 A, WO 2005/048352 A1, JP H09-260 650 A, EP 2 750 198 A1 and WO 2020/135378 A1 refer to semiconductor devices having a trench structure.

SUMMARY

Embodiments of the invention provide a power semiconductor device having an improved current density in an on-state.

In one embodiment, a power semiconductor device comprises a semiconductor body, at least one source region of a first conductivity type in the semiconductor body at a top side thereof, at least one channel region of a second conductivity type in the semiconductor body below the at least one source region, a drift region of the first conductivity type in the semiconductor body below the at least one channel region, at least one trench running from the top side through the at least one source region and through the at least one channel region and ending in the drift region, and a shield region which is of the second conductivity type and which is located below at least a part of the bottom side of the at least one trench, The at least one trench accommodates a gate electrode. Seen in top view of the top side, the at least one trench comprises non-linearly running side walls, and seen in top view of the top side, the at least one trench comprises a plurality of branch-offs, the shield region extends at least partially below at least one of the branch-offs.

BRIEF DESCRIPTION OF THE DRAWINGS

A power semiconductor device is explained in greater detail below by way of exemplary embodiments with reference to the drawings. Elements which are the same in the individual figures are indicated with the same reference numerals. The relationships between the elements are not shown to scale, however, but rather individual elements may be shown exaggeratedly large to assist in understanding.

In the figures.

DETAILED DESCRIPTION

Figure 1:
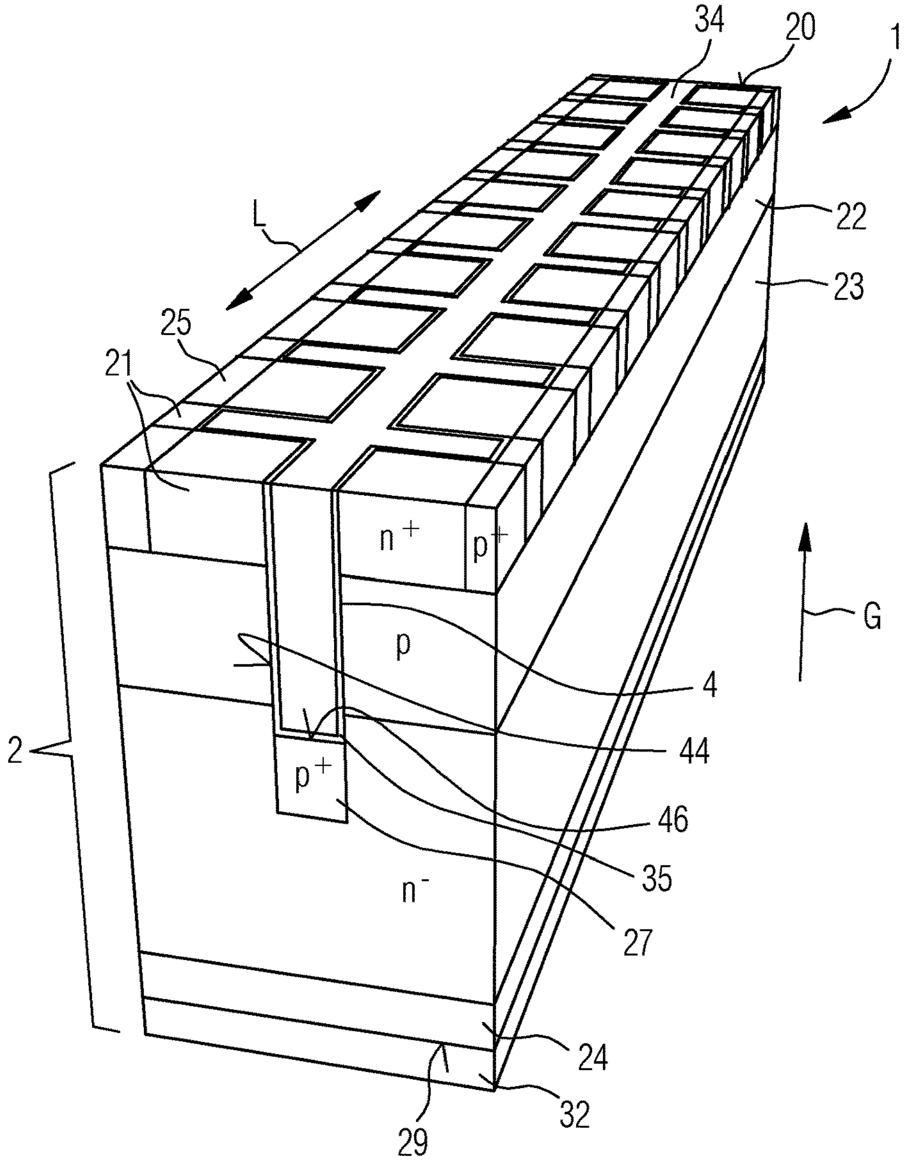
FIG. 1 is a schematic perspective view of an exemplary embodiment of a power semiconductor device described herein.

A power semiconductor device, which is, for example, based on a wide bandgap material, exemplarily silicon carbide, SiC for short, comprises a trench which has side walls with an extended length compared with just straight running trenches. Hence, an effective contact area between the trench and a channel region can be increased, resulting in a larger effective channel width, and a lower resistance of the power semiconductor device in an on-state can be achieved.

A description of various embodiments will first be discussed followed by examples discussed with respect to the drawings.

In at least one embodiment, the power semiconductor device comprises a semiconductor body, at least one source region of a first conductivity type in the semiconductor body at a top side thereof, at least one channel region of a second conductivity type in the semiconductor body below the at least one source region, a drift region of the first conductivity type in the semiconductor body below the at least one channel region, and at least one trench running from the top side through the at least one source region and through the at least one channel region and ending in the drift region. The at least one trench accommodates a gate electrode. Seen in top view of the top side, the at least one trench comprises non-linearly running side walls. Optionally, there is a shield region which is of the second conductivity type and which is located below at least a part of the bottom side of the at least one trench, and seen in top view of the top side, the at least one trench comprises a plurality of branch-offs, for example, the shield region extends completely or partially below one, some or all of the branch-offs.

For example, the semiconductor body is of SiC. However, the semiconductor body can alternatively be of Si or of another high-bandgap semiconductor material like $Ga_2O_3$ or GaN.

For example, the first conductivity type is n-type and the second conductivity type is p-type. Although in the following the description of the embodiments focusses on the afore-mentioned conductivity types, it is also possible that the first conductivity type is p-type and the second conductivity type is n-type.

The top side of the semiconductor body may be of planar fashion, despite in the area of the at least one trench.

In the semiconductor body, it is possible that there is only one source region, that is, one continuous region of the same conductivity type and of the same or of about the same doping concentration. However, there can also be a plurality of source regions separated from one another by other regions of the semiconductor body. The same applies analogously for the channel region or for the channel regions.

Here and in the following, the term 'source region' may refer both to a source in a field-effect transistor as well as to an emitter in a bipolar transistor.

It is possible that there is only one drift region completely extending across the semiconductor body in a direction perpendicular to a growth direction of the semiconductor body. However, in principle there can be a plurality of drift regions. For simplification, in the following examples only one drift region is explicitly mentioned.

A maximum doping concentration in the at least one channel region and in the at least one drift region may be lower than in the at least one source region.

Along the growth direction and/or along a direction perpendicular to the top side, the at least one source region, the at least one channel region and the drift region may directly follow on one another in the stated order. However, as an option, there may be at least one buffer layer and/or transition layer in-between the at least one source region, the at least one channel region and/or the drift region.

The at least one trench may end within the drift region so that the at least one trench does not completely run through the drift region. However, the trench may completely traverse the at least one source region and the at least one channel region, for example, in a direction perpendicular to the top side.

At a bottom side of the trench, there may be a shield region which is of the second conductivity type. The shield region may be congruent with the at least one trench, seen in top view of the top side, and may be completely embedded between the at least one trench and the drift region.

According to at least one embodiment, the shield region partly or completely extends below the central pipe. For example, the shield region is applied at at least 50% or 80% of an area of the central pipe, seen in top view of the top side.

According to at least one embodiment, the shield region is limited to the central pipe. That is, the at least one branch-off is provided with the shield region for at most 10% or for at most 20% of an area of the at least one branch-off, seen in top view of the top side.

According to at least one embodiment, the shield region partly or completely extends below the central pipe as well as below the at least one branch-off. For example, the shield region is applied at at least 90% or 95% of an area of the central pipe as well as of the at least one branch-off, seen in top view of the top side.

According to at least one embodiment, the shield region is limited to the at least one branch-off. That is, the central pipe is provided with the shield region for at most 10% or for at most 20% of an area of the central pipe, and the at least one branch-off is provided with the shield region for at least 80% or for at least 90% of an area of the at least one branch-off, seen in top view of the top side.

According to at least one embodiment, wherein there is a plurality of the branch-offs, the shield region is limited to the branch-offs and at least one region of the central pipe between the respective branch-offs located on opposite sides of the central pipe. In other words, seen in top view, the shield region is formed by a plurality of bars oriented perpendicular to the central pipe, the bars connect two opposite branch-offs.

According to at least one embodiment, wherein there is a plurality of the branch-offs, the shield region is limited to at least one intersection region of the branch-offs and the central pipe. That is, the intersection region is below inner corners of the branch-offs at the central pipe, but side walls of the branch-offs and of the central pipe are virtually free of the intersection region. For example, the shield region is below at most 20% or at most 10% of the side walls of the branch-offs and/or of the central pipe, seen in top view of the top side.

According to at least one embodiment, the shield region extends only partially below at least some of the branch-offs. Hence, the at least one trench protrudes from the shield region in places or all around, seen in top view of the top side. For example, at least 50% and/or at most 90% of an area of each one of the branch-offs is provided with the shield regions, seen in top view of the top side.

The gate electrode may completely be accommodated in the at least one trench. Otherwise, the gate electrode may protrude from the at least one trench, for example, to enable external electrical contacting the gate electrode. Per trench, there may be exactly one gate electrode. If there is a plurality of the trenches, there may be one separate gate electrode per trench, or there is a common gate electrode for all the trenches, or there are groups of trenches sharing one gate electrode.

For example, the gate electrode is separated from the semiconductor body by means of a gate insulator. For example, the gate insulator is of at least one of the following materials: $SiO_2$, $Si_3N_4$, $Al_2O_3$, $Y_2O_3$, $ZrO_2$, $HfO_2$, $La_2O_3$, $Ta_2O_5$, $TiO_2$.

That the side walls of the at least one trench run in a non-linear manner may mean that, seen in top view of the top side and, for example, in the plane defined by the top side, the side walls have a stepped, square wave, saw tooth or sinusoidal contour. It is possible that the trench, or each one of the trenches, has/have two of the non-linearly running side walls. Seen in top view of the top side, the side walls may be connected by a front side of the respective trench, also referred to as front end or front face.

In the power semiconductor device described herein, an enhancement of the effective channel region size, for example, in silicon carbide, SiC, trench MOSFET devices is proposed. The design introduces alternating, for example, rectangular or zigzag type, step features changing around in-plane perpendicular to the [0001]-direction, which may be a direction referring to a trench depth, so that the side walls are formed not only along the [$\bar{1}$100]-direction, but also along the [11$\bar{2}$0]-direction, wherein the semiconductor body may be of 4H—SiC. Compared to an only stripe-like trench, this design allows to maximize the total width of the channel region in the device for a given pitch size. The additional parallel conduction of the extra side wall portions in the trench enables high current capability, and therefore lower on-state resistance, also referred to as $R_{ON}$.

Trench gate power MOSFET devices represent one of the most promising technologies to meet the energy efficiency demand and performance requirements in power electronics. One approach in developing a trench MOSFET device is the so-called V-grooved MOSFET, VMOSFET for short. The generation of high electric fields at the tip of fully etched sharp V-structures can be partially reduced by the premature termination of the etching step as to produce a flat bottom groove, at expenses of reducing high scale integration capability. This design can further be improved by opening rectangular grooves where the trench side walls, typically etched along non-polar crystal faces, define the MOS inversion channel. This UMOSFET-type called structure offers a significant reduction in on-state resistance per unit area due to the absence of the junction field-effect transistor, JFET, region, which leads to smaller cell-pitches, and also because of the higher mobility of charge carriers on the non-polar faces in SiC devices.

Some other promising designs include so-called pn super junctions, SJ for short, which have been intended to improve the trade-off between specific on-state resistance and breakdown voltage. This may be achieved by forming a parallel array of p-doped and n-doped thin layers interposed in the drift region. Reduction of on-state resistance and high breakdown voltage can be achieved by means of proper control of the maximum doping concentrations and the thicknesses of these layers.

Vertical trench gate MOSFET devices based on SJ structures are much more challenging to fabricate compared to planar devices but have shown a reduction of about 30% or even more in $R_{ON}$ with respect to the conventional trench gate structures. SJ trench designs are promising but involve a higher level of complexity during device processing.

The lateral scaling, or pitch reduction, has been one of the most adopted approaches for lowering $R_{ON}$, probably due to a more straightforward process implementation, but it is strongly limited by integration constraints and it increases a gate charge. However, vertical trench MOSFETs offer much more flexibility, and the combination of larger effective channel area and higher mobility along the non-planar trench side walls enables lower on-state resistance in comparison to the conventional planar MOSFET.

In the semiconductor device described herein, for example, the device comprises a trench etched deep inside the [0001]-direction into the semiconductor body and having short sections of trench sidewalls parallel to the $[\bar{1}100]$-direction and the $[11\bar{2}0]$-direction. Thus, the side wall orientation changes alternatively from one to other direction whereas the main axis of the at least one trench propagates along the $[\bar{1}100]$-direction like in the conventional trench MOSFET design. The advantage of the design proposed herein is, for example, that for a given pitch size the resulting channel region width increases compared to the estimated width in a conventional UMOSFET trench.

Thus, in this proposed design, the side wall area of the at least one trench along the $[\bar{1}100]$-direction equals the total trench side wall area in the standard stripe-like trench design. Therefore, all those side wall portions etched along the $[11\bar{2}0]$-direction introduce additional contributions, resulting in, for example, roughly 40% increase of channel area for the same cell pitch. The optimal side wall step length along the $[11\bar{2}0]$-direction can be chosen according to the trade-off between increasing channel width and preventing too large pitch size.

According to at least one embodiment, the semiconductor body is of SiC and a direction of main extent of the at least one trench runs along a $[\bar{1}100]$-direction of the SiC. The direction of main extent may be that region along which the at least one trench has its maximum geometric dimension and/or that is along a longest axis of symmetry of the respective trench.

According to at least one embodiment, at least one or some or each one of the side walls comprises at least one portion next to the at least one source region running transversely to the $[\bar{1}100]$-direction of the SiC. For example, said portion runs perpendicular to the $[\bar{1}100]$-direction, for example, along the $[11\bar{2}0]$-direction. Otherwise, an angle between the $[\bar{1}100]$-direction and said side wall portion is at least 45° or at least 60° or at least 70° and/or at most 85° or at most 75°. It is possible that different transversely running side wall portions have different angles towards the $[\bar{1}100]$-direction.

According to at least one embodiment, seen in top view of the top side, an overall length of at least one, of some or of each one of the side walls exceeds a length of the at least one trench by at least a factor of 1.2 or by at least a factor of 1.3 or by at least a factor of 1.4. The length of the at least one trench may refer to an extent of the respective trench along the direction of main extent. The length of the at least one trench may also be called effective extension or effective length. Exemplarily, the non-linearly running side walls, for example, the increase of overall length of the side walls compared to the effective length of the gate, is present over the whole depth direction of the trench. Thus, by means of the non-linearity of the side walls, seen in top view of the top side, the length of the side walls and, hence, the channel region are can significantly be increased.

According to at least one embodiment, with a tolerance of at most 15° or of at most 5°, the side walls are oriented perpendicular to the top side. Optionally, a trench bottom runs in parallel with the top side, for example, with a tolerance of at most 15° or of at most 5°, too. The bottom side may connect the two side walls of the respective trench. Thus, the respective trench may be U-shaped or ⊔ -shaped when seen in cross-section through the top side and perpendicular to the direction of main extent. Of course, the features in this paragraph may be combined, for example, with some or all of the features in the previous paragraph.

According to at least one embodiment, seen in top view of the top side, the at least one trench comprises a central pipe running straightly, for example, along the direction of main extent. For example, the central pipe is of constant, non-varying width, seen in top view of the top side. Further, the central pipe may be of constant thickness, in the direction away from the top side. That is, the central pipe may be formed as a linear bar.

According to at least one embodiment, the at least one trench comprises a plurality of branch-offs branching from the central pipe. The branch-offs may be regarded as lateral extensions of the central pipe. The branch-offs may be arranged at the central pipe in a regular and/or equidistant manner. The branch-offs and the central pipe may be just one piece, but may otherwise be of multi-piece fashion.

If a trench comprises a plurality of branch-offs on opposite side walls, the branch-offs may be arranged symmetrically on both side walls, that is, facing each other, or the branch-offs may be arranged in an offset or displaced manner.

According to at least one embodiment, one or some or all of the branch-offs are of square or rectangular shape, seen in top view of the top side. That is, the respective neighboring portions of the at least one respective side wall are arranged perpendicular to one another.

According to at least one embodiment, one or some or all of the branch-offs are of trapezoidal shape, seen in top view of the top side. The respective trapezoid is, for example, a symmetric trapezoid with an axis of symmetry perpendicular to the direction of main extent of the respective trench. Alternatively or additionally, one or some or all of the branch-offs may be of polygonal shape when seen in top view of the top side.

According to at least one embodiment, one or some or all of the branch-offs which are of trapezoidal shape widen in a direction away from the central pipe, seen in top view of the top side. Hence, a broadest part of the respective branch-off is remote from the central pipe.

According to at least one embodiment, one or some or all of the branch-offs which are of trapezoidal shape narrow in a direction away from the central pipe, seen in top view of the top side. Hence, a broadest part of the respective branch-off is next to the central pipe.

According to at least one embodiment, one or some or all of the branch-offs are of trigonal shape, seen in top view of the top side. That is, the respective trench may appear as a single-sided or double-side saw, seen in top view. At least one or some or all of the trigonal branch-offs may be shaped symmetrically, with an axis of symmetry perpendicular to the direction of main extent of the respective trench. An opening angle of the triangle forming the respective branch-off, at a tip facing away from the central pipe, is, for example, at least 45° or at least 90° or at least 120°. Alternatively or additionally, said opening angle is at most 150° or at most 125° or at most 100°. For example, the opening angle is between 90° and 150° inclusive or between 45° and 125° inclusive.

According to at least one embodiment, each one of the side walls comprises a plurality of the branch-offs. All the branch-offs of the respective side wall, or all the branch-offs of the respective channel, may be of the same shape. Otherwise differently shaped branch-offs may be combined in the respective trench.

According to at least one embodiment, seen in top view of the top side, the at least one trench is of a meander shape. This means, for example, that said at least one trench is free of a straight connection line between opposite ends of the at least one trench and completely running in or on top of the at least one trench. In other words, if the trench were empty, no rigid and straight stick could be pulled through the respective trench.

According to at least one embodiment, seen in top view of the top side, the at least one trench is at least one of zigzag shape, sinusoidal shape and square wave shape. This may apply to trenches having a straight connection line as defined above, or having no such a straight connection line.

According to at least one embodiment, the power semiconductor device further comprises a plurality of plugs of the second conductivity type in the semiconductor body, for example, at the top side. The plugs may be configured to provide electric contact paths from the top side to the at least one channel region. Hence, the plugs may traverse the at least one source region and may be in direct contact with the at least one channel region as well as with the top side. It is possible that the plugs and the at least one source region, and consequently the at least one channel region, are on the same electric potential.

According to at least one embodiment, the plugs are arranged distant from the at least one trench, seen in top view of the top side. In this case, the plugs may not touch the at least one trench. The at least one source region may be arranged between the plugs and the at least one trench. Otherwise, the plugs could touch the at least one trench, for example, in a point-like manner, that is, there may be no contact surfaces but only contact lines between the at least one trench and the respective plug.

According to at least one embodiment, seen in top view of the top side, there are straight strips next to the at least one trench, the at least one trench is located between two adjacent straight strips. The straight strips may touch the at least one assigned trench, for example, in a point-like manner, or the straight strips are distant from the at least one assigned trench. In the straight strips, portions of the at least one source region and the plugs can be arranged in an alternating manner.

According to at least one embodiment, the power semiconductor device comprises a plurality of the trenches and as an option a plurality of the source regions or only one source region. Seen in top view of the top side, the trenches and the at least one associated source region could be arranged in an alternating manner in a direction transverse to the trenches. The trenches may be arranged in parallel with each other, that is, with parallel directions of main extent or with parallel axes of symmetry.

According to at least one embodiment, the power semiconductor device is a field-effect transistor or an insulated gate bipolar transistor. For example, the power semiconductor device described herein is or is comprised in, for example, a MOS-based SiC trench device such as MOSFETs and IGBTs. Hence, the power semiconductor device is or can be present in, for example, a device selected from the group comprising or consisting of a metal-oxide-semiconductor field-effect transistor (MOSFET), a metal-insulator-semiconductor field-effect transistor (MISFET), an insulated-gate bipolar transistor (IGBT), a bipolar junction transistor (BJT), and a junction gate field-effect transistor (JFET). The power semiconductor device described herein may also be part of a thyristor like a gate turn-off thyristor (GTO) or a gate commutated thyristor (GCT).

According to at least one embodiment, the semiconductor body further comprises a collector region. The collector region is of the same conductivity type as the channel region. The collector region may be located at a bottom side of the semiconductor body opposite the top side. There can be one collector region for all the source regions, if there is a plurality of source region. A collector electrode can be directly applied to the collector region. If there is a collector region, the power semiconductor device can be an IGBT.

According to at least one embodiment, the semiconductor further comprises at least one drain region. The drain region is of the same conductivity type as the at least one source region. For example, the drain region is a layer at the bottom side. For example, the drift region is located between the at least one source region and the drain region. There can be one common drain region for all the source regions, if there is a plurality of source region. A drain electrode may be in direct contact with the at least one drain region. If there is a drain region, the power semiconductor device can be a MOSFET or a MISFET.

According to at least one embodiment, the power semiconductor device comprises at least two of the source regions and a source electrode. The source electrode is in electric contact, for example, in direct contact, with at least two of the source regions or with all source regions. Hence, said at least two source regions can be on the same electric potential. As an option, the source electrode may also be in direct contact with the at least one plug.

According to at least one embodiment, seen in cross-section perpendicular to the top side, the gate electrode is located between the at least two source regions. Hence, two source regions can be assigned to one gate electrode. The source regions may be arranged in a symmetric manner next to the respective gate electrode.

According to at least one embodiment, the power semiconductor device is a power device. For example, the power semiconductor device is configured for a maximum current through the at least one channel region of at least 1 A or of at least 20 A. Alternatively or additionally, the power semiconductor device is configured for a maximum voltage of at least 0.2 kV or of at least 0.6 kV or of at least 1.2 kV.

The power semiconductor device is, for example, for a power module in a vehicle to convert direct current from a battery to alternating current for an electric motor, for example, in hybrid vehicles or plug-in electric vehicles.

Moreover, the power semiconductor device can be a fuse, for example, in a vehicle like a car.

Reference will now be made to the figures.

In FIGS. 1 to 4, an exemplary embodiment of a power semiconductor device 1 is illustrated. The power semiconductor device 1 comprises a semiconductor body 2. At a top side 20, the semiconductor body 2 comprises a plurality of source regions 21. As an option, there is a plurality of plugs 25 on the top side 20, too. The plugs 25 are configured to electrically contact the channel regions 22 which are located below the source regions 21 and the plugs 25. The plugs 25 and the source regions 21 may have the same or different thicknesses along a growth direction G of the semiconductor body 2.

Further, in the semiconductor body 2 there is a drift region 23 below the channel regions 22. The channel region 22 separates the source region 21 from the drift region 23.

If the power semiconductor device 1 is a MISFET or a MOSFET, then there can be an optional drain region 24 below the drift region 23 at a bottom side 29 of the semiconductor body 2 opposite the top side 20. The drain region 24 is electrically contacted by means of a drain electrode 32. As can be seen, for example, from FIGS. 3 and 4, at the top side there is a source electrode 31 that electrically contacts all the source regions 21 as well as the plugs 25.

The afore-mentioned regions 21, 22, 23, 24 may directly follow one on top of the other along the growth direction G of the semiconductor body 2. Thus, the semiconductor body 2 may be epitaxially grown at least in part. Further, the semiconductor body 2 may comprise a substrate, now shown, on which the other regions, for example, regions 22, 21, 25, are grown on.

Moreover, there is a trench 4 in the semiconductor body 2 which runs from the top side 20 through the source regions 21 and the channel regions 22 and terminates in the drift region 23. The trench 4 has a direction L of main extent along which the trench 4 comprises a straightly running central pipe 41. To increase an effective channel width, the trench 4 comprises a plurality of branch-offs 42 that run away from the central pipe 41. Hence, due to the branch-offs 42, a length of side walls 44 of the trench 4 is increased. Seen in cross-section, the trench 4 is roughly of ⊔ -shape, so that a trench bottom 46 runs in parallel or approximately in parallel with the top side 20. The side walls 44 consequently run perpendicular or approximately perpendicular to the top side 20.

In the trench 4, there is a gate electrode 34. The gate electrode 34 is electrically separated from the semiconductor body 2 by means of a gate insulator 35. A further insulator which electrically separates the source electrode 31 from the gate electrode 34 is not explicitly shown in the figures. For simplicity, the gate insulator 35 is not illustrated in the following figures.

As an option, below the trench 4, at the trench bottom 46 and embedded in the drift region 23, there is a shield region 27. The shield region 27 may be below the central pipe 41 and below the branch-offs 42, or only below the central pipe 41.

The shield region 27 below the trench bottom 46 which may be produced by implanting ions can be used in order to shield the gate insulator 35 from high electric fields in the blocking condition. The shield region 27 can either be left floating, or can be contacted to the same source region potential. Seen in cross-section, the shield region 27 may be of square or rectangular shape.

Seen in top view, the branch-offs 42 are of rectangular shape and are arranged in a regular. The branch-offs 42 at the two side walls 44 lie opposite to one another so that a long axis of symmetry of the trench 4 runs along the direction L of main extent. It is possible that an extent of the branch-offs 42 in the direction away from the central pipe 41 is larger than a width of the central pipe 41 without the branch-offs 42. Moreover, a distance between adjacent branch-offs 42 may be larger than a length of the branch-offs 42, in the direction perpendicular to the central pipe 41, and may also be larger than the width of the central pipe 41.

As an option, there are strips 48 running in parallel with the direction L of main extent. The strips 48 may be of straight fashion. In the strips 48, the source regions 41 and the plugs 25 are arranged in an alternating manner. In this respect, the source regions 41 may be only at front ends of the branch-offs 42 so that at corners of the branch-offs 42 close to the strips 48, the plugs 25 may touch the trench 4, for example, in a point-like fashion, seen in top view, compare FIG. 2. Hence, the strips 48 are in contact with the trench 4 only at the front ends of the branch-offs 42. Areas between adjacent branch-offs 42 may be completely composed of the source regions 21.

Figure 2:
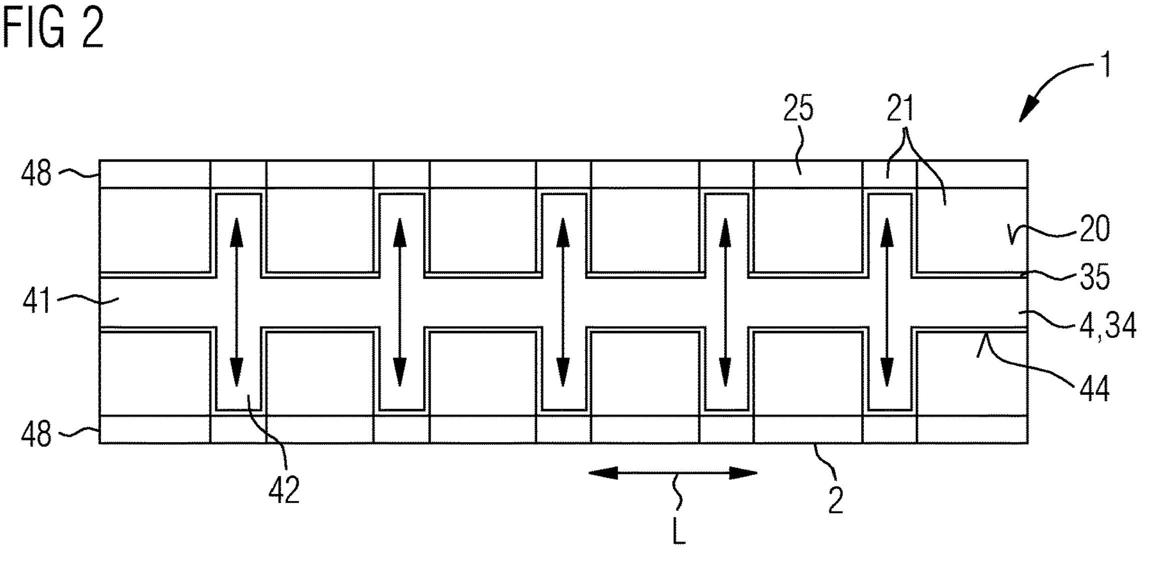
FIG. 2 is a schematic top view of the power semiconductor device of FIG. 1, FIGS. 3 and 4 are schematic sectional views of the power semiconductor device of FIG. 1.
Figure 3:
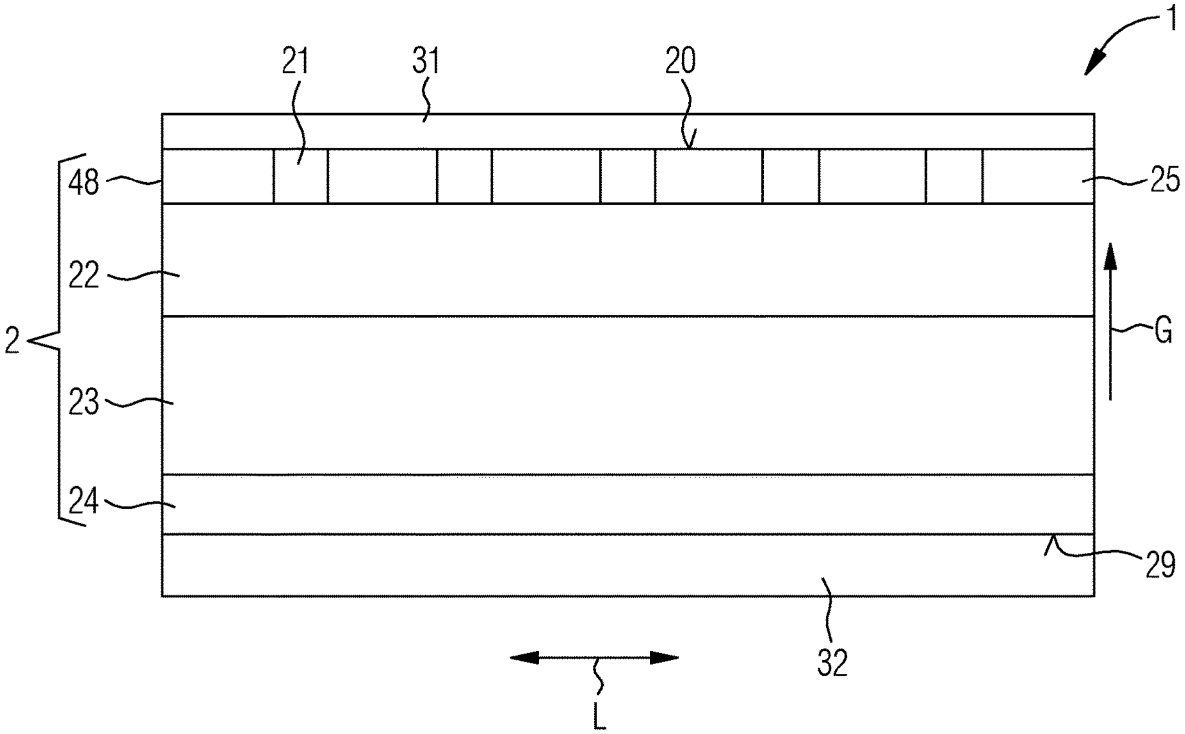
Figure 4:
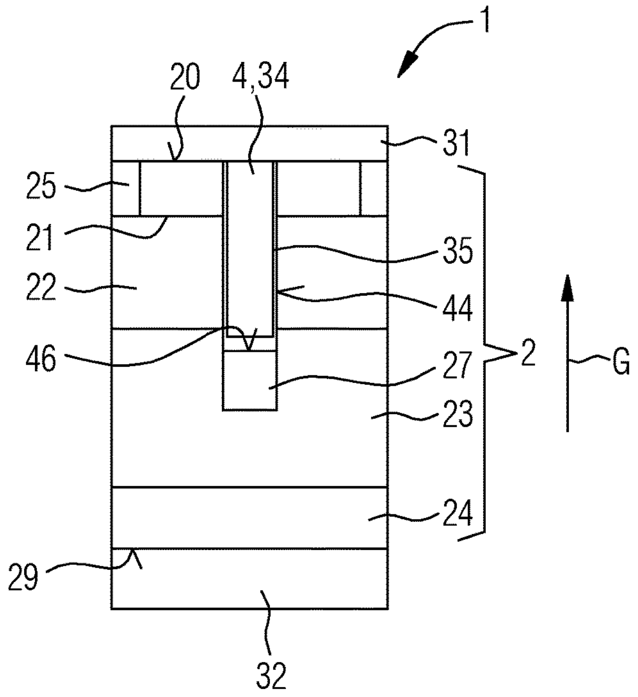

In FIGS. 1 and 2, the semiconductor body 2 comprises only one trench 4. However, the configuration shown in FIGS. 1 and 2 can be regarded as a basic unit that may be arranged next to one another various times, for example, in a repetitive manner. Hence, the basic units can be adjacent to one another and, in the direction perpendicular to the direction L of main extent, a couple of said basic units may follow one another. Accordingly, a pitch of the basic units and therefore a pitch of the trenches may correspond to the width of the respective trench 4 at the branch-offs 42, plus once or twice a width of the strips 48.

For example, the source regions 21 and the optional drain region 24 are highly $n^+$-doped and the drift region 23 is lower n-doped or $n^-$-doped; the channel regions 22 are p-doped and the optional plugs 25 are higher $p^+$-doped as well as the optional shield region 27. Otherwise, the doping types could all be inverted.

For example, maximum doping concentrations of the source regions 21, the optional drain region 24 and the plugs 25 are at least $1\times10^{18}$ cm$^{-3}$ or at least $5\times10^{18}$ cm$^{-3}$ or at least $1\times10^{19}$ cm$^{-3}$ and/or at most $5\times10^{20}$ cm$^{-3}$ or at most $2\times10^{20}$ cm$^{-3}$ or at most $1\times10^{20}$ cm$^{-3}$. Further, a maximum doping concentration of the channel regions 22 may be at least $5\times10^{16}$ cm$^{-3}$ or at least $1\times10^{17}$ cm$^{-3}$ and/or at most $5\times10^{19}$ cm$^{-3}$ or at most $5\times10^{18}$ cm$^{-3}$. Depending on the voltage class of the power semiconductor device 1, a maximum doping concentration of the drift region 23 may be at least $1\times10^{14}$ cm$^{-3}$ or at least $5\times10^{14}$ cm$^{-3}$ or at least $1\times10^{15}$ cm$^{-3}$ and/or at most $1\times10^{17}$ cm$^{-3}$ or at most $5\times10^{16}$ cm$^{-3}$ or at most $1\times10^{16}$ cm$^{-3}$.

Figure 5:
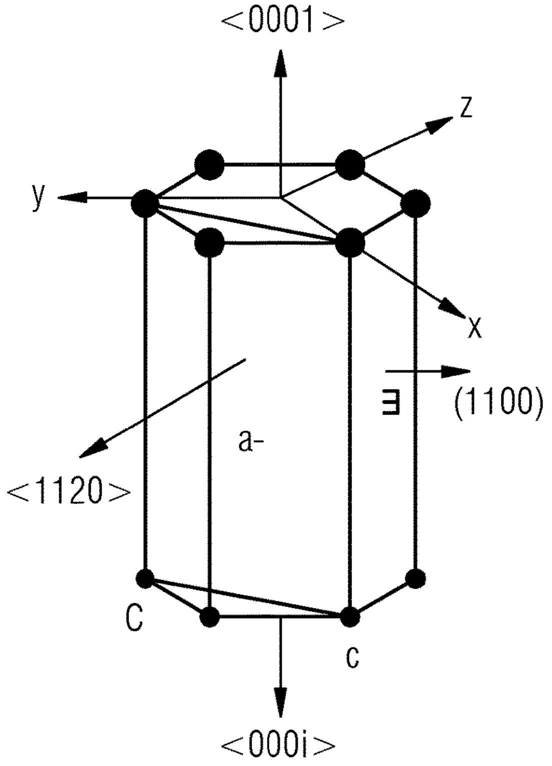
FIG. 5 is a schematic representation of crystallographic orientations in SiC.

For better understanding, in FIG. 5 the basic crystallographic planes of SiC are illustrated because the power semiconductor device 1 described herein may be based on SiC. It is noted that the trenches 4 described herein may run into the semiconductor body along the [0001]-direction and that the direction L of main extent is along the [$\bar{1}$100]-direction so that the central pipe 41 is in parallel with the [$\bar{1}$100]-direction. Accordingly, the branch-offs 42 shown in FIGS. 1 and 2, for example, may extend into the [11$\bar{2}$0]-direction. Hence, all the side walls 44 in the exemplary embodiment of FIGS. 1 to 4 may exclusively run along the [$\bar{1}$100]-direction and the [11$\bar{2}$0]-direction.

Figure 6:
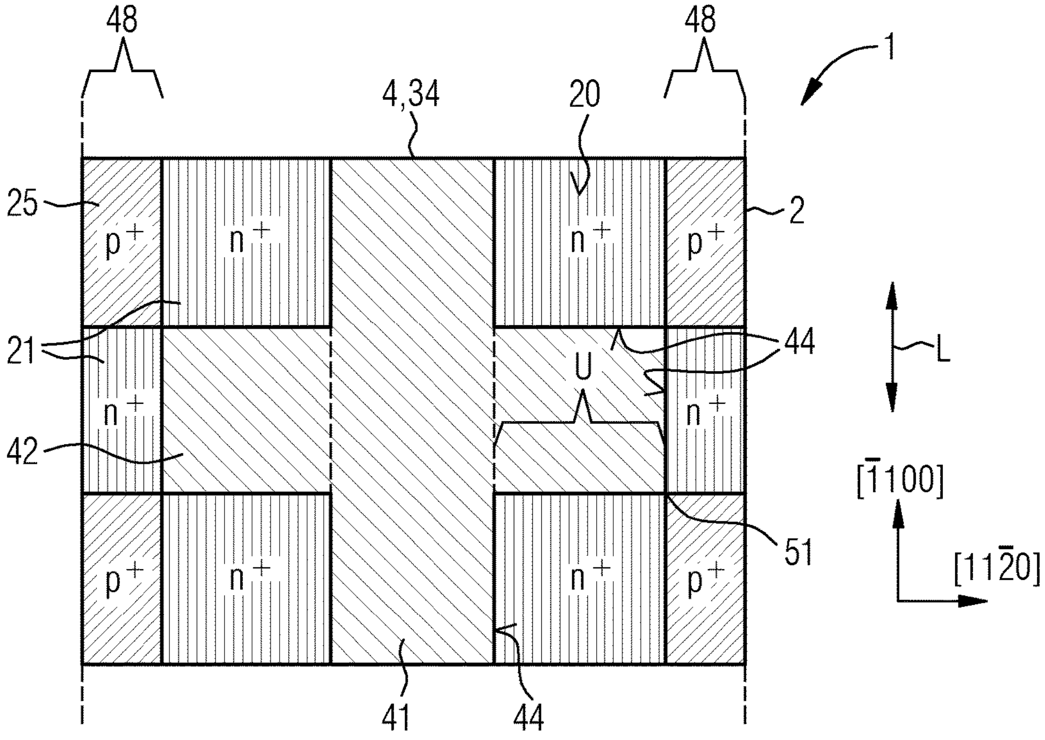
FIGS. 6 to 13 are schematic top views of exemplary embodiments of power semiconductor devices described herein.

In FIG. 6, another exemplary embodiment of the power semiconductor device 1 is illustrated in a top view of the top side 20. Only one primitive cell is illustrated. A plurality of such primitive cells may follow one another along the direction L of main extent so that the basic unit explained above can be composed of more than one such primitive cell, and a plurality of such basic units can be arranged next to one another side by side.

According to FIG. 6, an extent of the branch-offs 42 away from the central pipe 41 corresponds to a minimum size U of a structural unit. Thus, U may describe the smallest step size of the channel width. For example, U is at least 0.2 μm or at least 0.5 μm and/or U is at most 5 μm or at most 2 μm. In the strips 48, again the plugs 25 are segmented along the $[\bar{1}100]$-direction to prevent increasing pitch size. Seen in top view, in contact points 51 the plugs 25 may touch the trench 4.

Otherwise, the same as to FIGS. 1 to 5 may also apply for FIG. 6.

Figure 7:
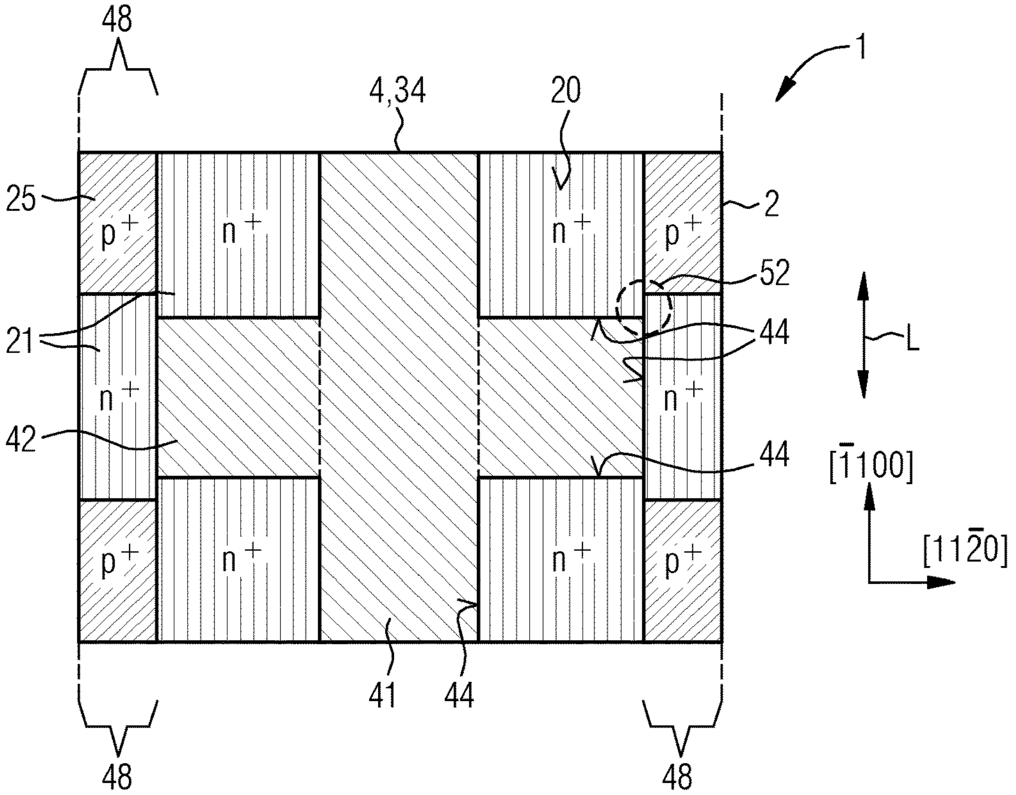

Regarding FIG. 7, the source regions 21 in the laterally arranged strip 48 can be extended along the direction L of main extent towards the plugs 25 so that overlap regions 52 result. This helps to reduce the formation of an extended depletion region around the corner, which would eventually reduce the effective channel width at those points. For example, the overlap regions 52 has an extent along the direction L of at least 0.1 U and/or of at most 0.5 U. For example, a width of the stripe 48 is at least 0.2 U and/or at most 0.8 U.

Accordingly, because of the overlap regions 52 the source regions 21 between adjacent branch-offs 42 merge with the source regions 21 in the strip 48 so that one continuous source region 21 may result per side wall 44.

Otherwise, the same as to FIGS. 1 to 6 may also apply for FIG. 7.

Figure 8:
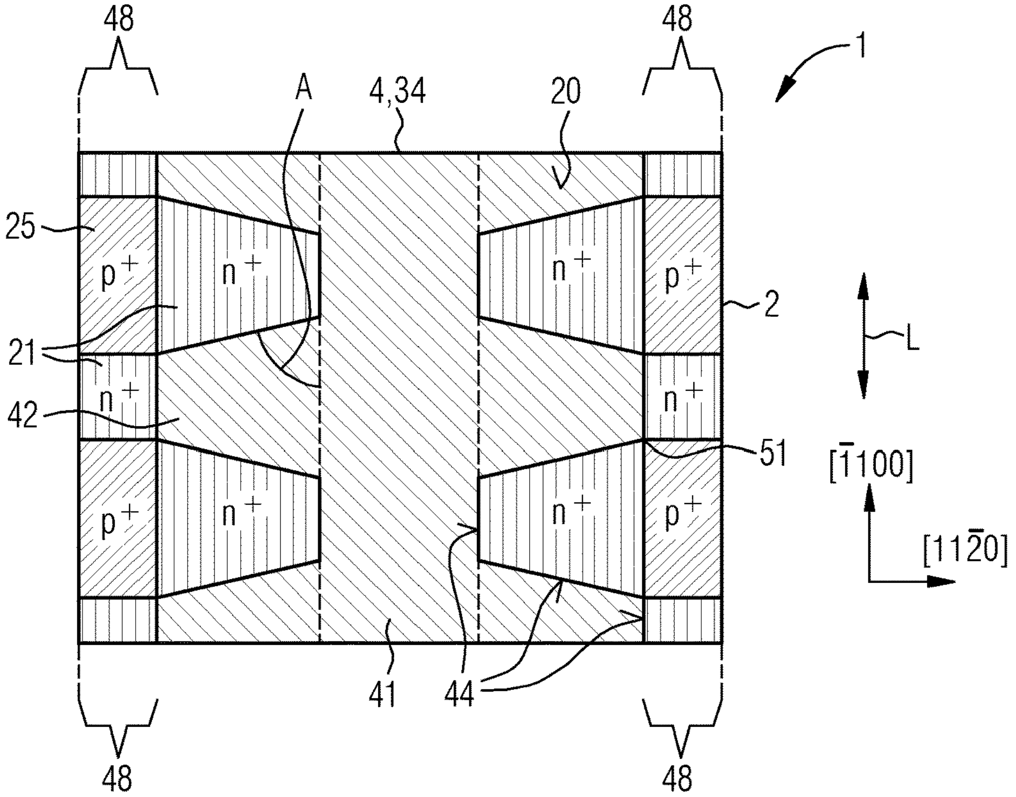

According to FIG. 8, the branch-offs 42 running away from the central pipe 41 are of trapezoidal shape and narrow in the direction away from the central pipe 41. An axis of symmetry of the branch-offs 42 is oriented perpendicular to the direction L. For example, an angle A between the direction L and the transversely running side wall 44 is at least 45° and/or at most 80°, or is at least 55° and/or at most 70°. Such designs of the branch-offs 42 can be used to optimize the trench performance keeping the same cell pitch.

As in FIG. 6, there are contact points 51 at which the plugs 25 as well as the source regions 21 touch the front ends of the branch-offs 42. Again, said front ends of the side walls 44 run in parallel with the direction L.

Thus, the side walls 44 of the at least one trench 4 can be accomplished along different directions apart from $[\bar{1}100]$ and $[11\bar{2}0]$. Likewise, the angle A between alternating trench side walls 44 can be chosen to explore benefits from different crystallographic planes perpendicular to top side 20, for example, to improved mobility offered by nonpolar faces of 4H—SiC.

Otherwise, the same as to FIG. 6 may also apply for FIG. 8.

Figure 9:
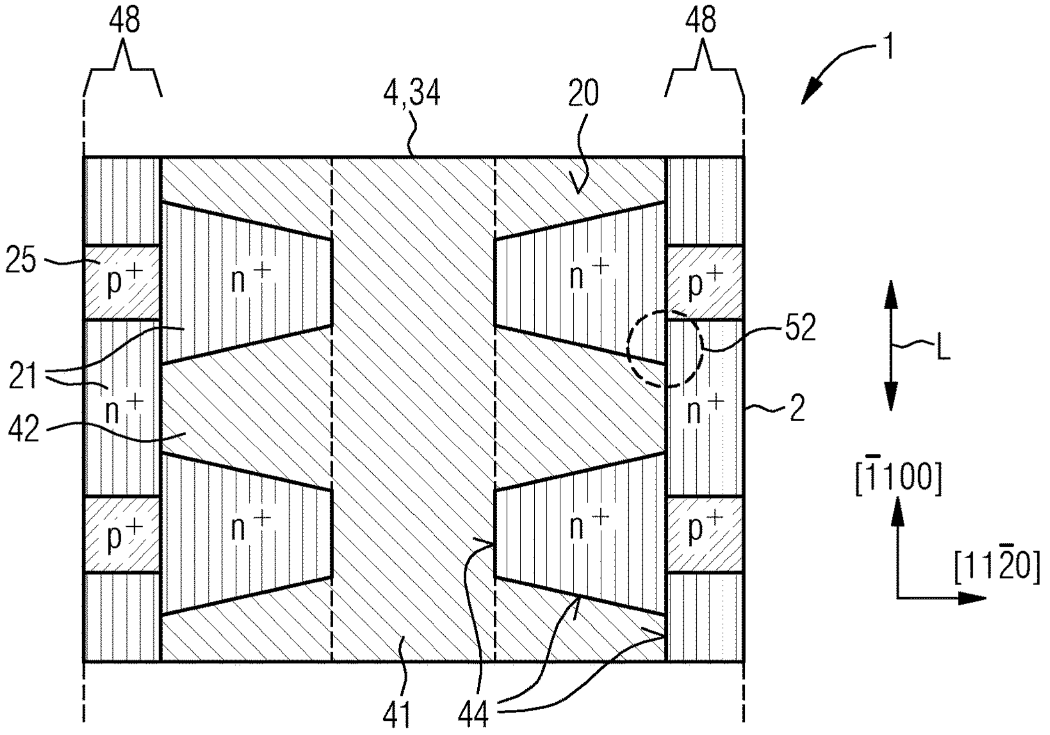

In FIG. 9 it is illustrated that there are overlap regions 52 in the strips 48 analogous to FIG. 7.

Otherwise, the same as to FIG. 8 may also apply for FIG. 9.

Figure 10:
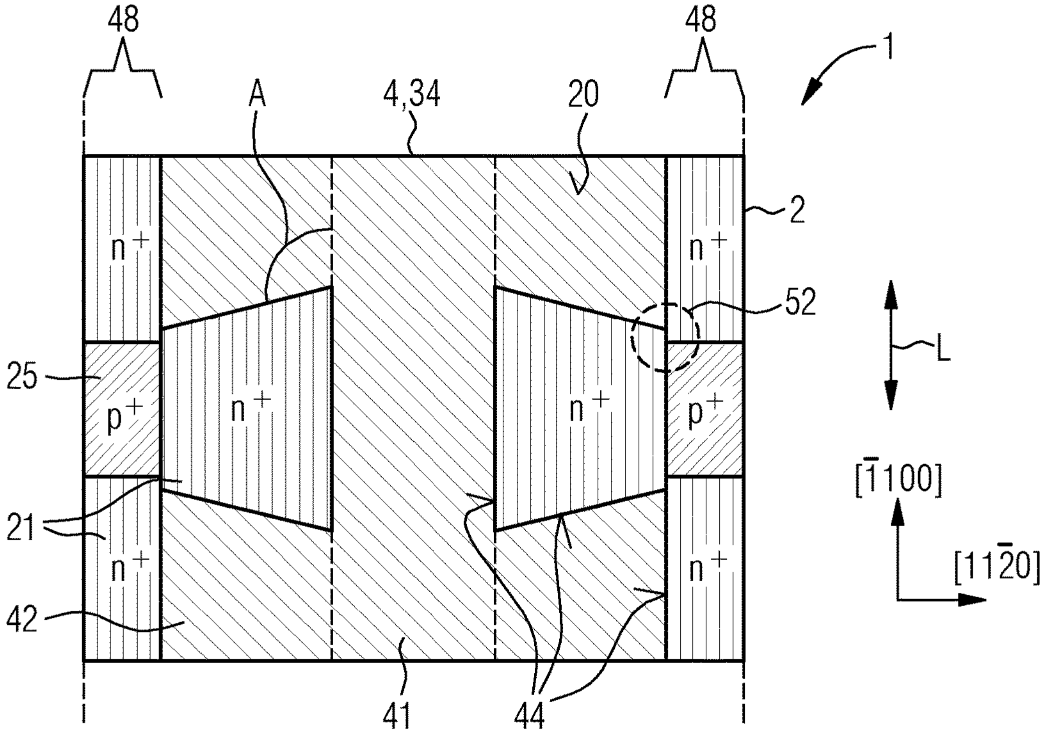

According to FIG. 10, the branch-offs 42 are of trapezoidal shape, too, but widen in the direction away from the central pipe 41. Consequently, the angle A is larger than 90° and is, for example, at least 100° and/or at most 135°, or is at least 110° and/or at most 125°.

The configuration of FIG. 10 is illustrated having the contact regions 52, but could of course be realized with contact points 51 instead, compare, for example, FIG. 8.

Otherwise, the same as to FIGS. 1 to 9 may also apply for FIG. 10.

Figure 11:
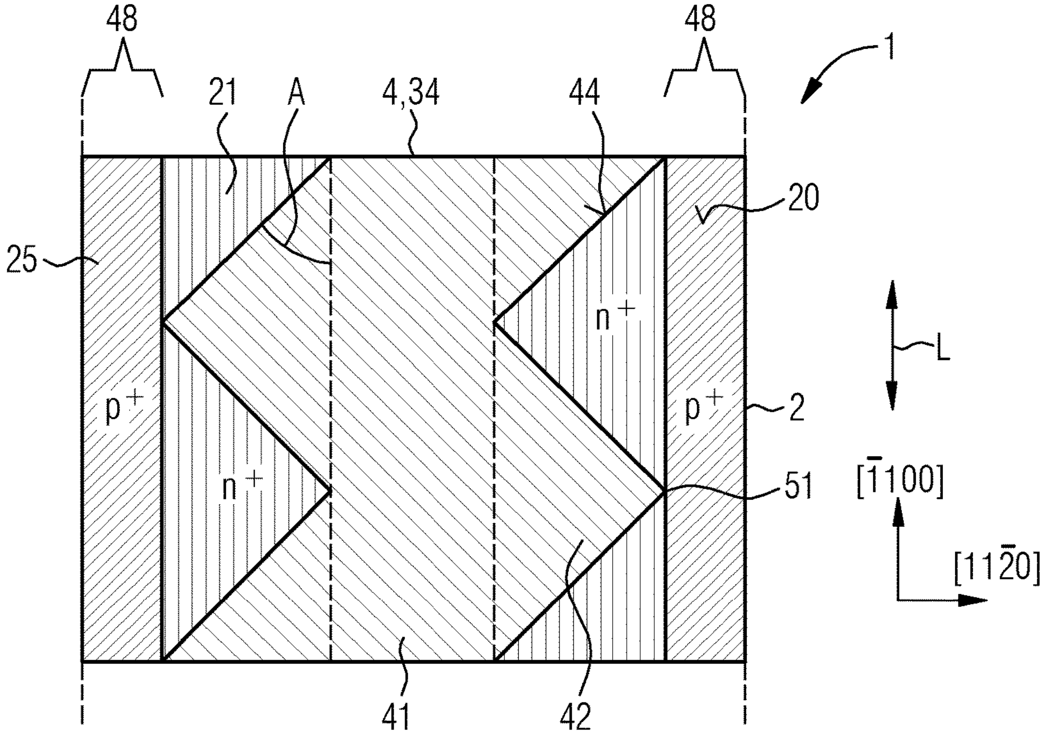

According to FIG. 11, the branch-offs 42 are of trigonal shape, seen in top view. Thus, the trench 44 may be free of side walls 44 running along the $[\bar{1}100]$ and $[11\bar{2}0]$ directions. For example, the angle A is at least 30° and/or at most 80°, or is at least 45° and/or at most 70°.

In FIG. 11, there is a continuous strip of the plug 25 along the direction L on each side of the trench 4, seen in top view. Thus, at tips of the branch-offs 42 the plugs 25 may touch the side walls 44. Otherwise, see FIG. 12, there can be the strips 48 with alternating source regions 21 and plugs 25 so that a continuous, merged source region 21 results on each side of the trench 4, seen in top view.

Figure 12:
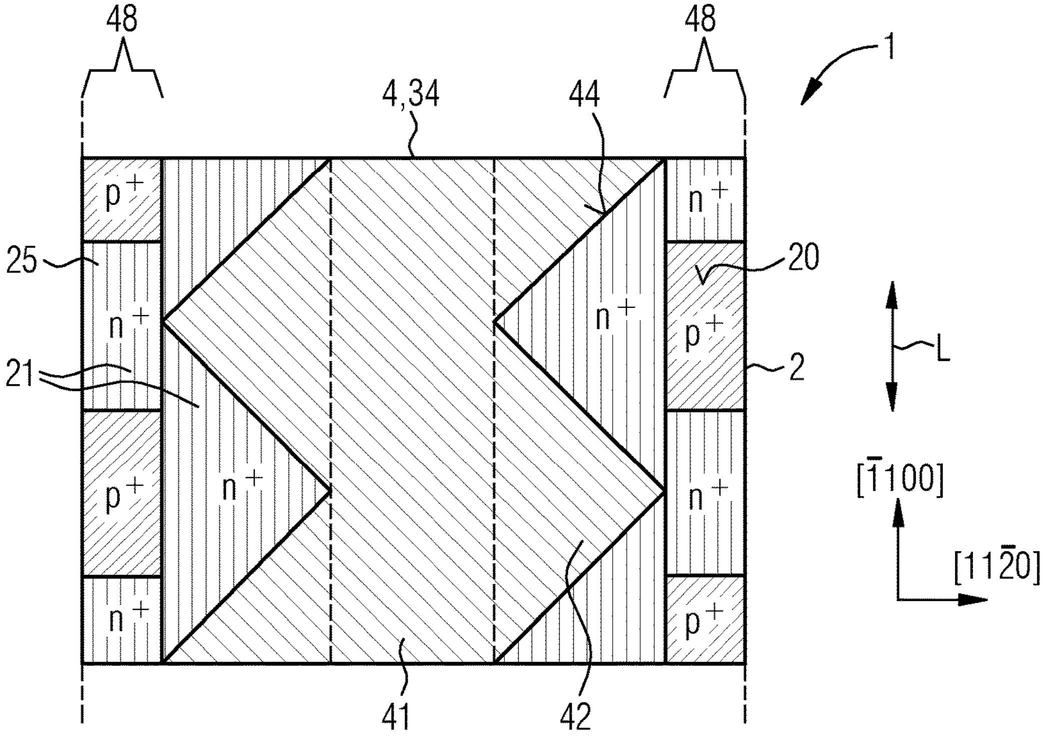

Otherwise, the same as to FIGS. 1 to 10 may also apply for FIGS. 11 and 12.

In the embodiments of FIGS. 1 to 4 and 6 to 12, there is always the continuous, straight central pipe 41 so that ends of the trench 4 can be connected by a straight line which runs only within the trench 4. Contrary to that, see FIG. 13, the trench 4 is of square signal shape, seen in top view. For example, seen in top view, a width of the trench 4 in areas running in parallel with the direction Lis smaller than an inner leg length B of the U's or ⊔ 's.

Thus, the sections of the trench 4 are formed of U's or ⊔ 's with alternating orientations, when seen in top view. The optional plugs 25 may range into the U's or ⊔ 's, or contrary to what is shown in FIG. 13, may be distant from inner portions of the U' or ⊔ 's.

Figure 13:
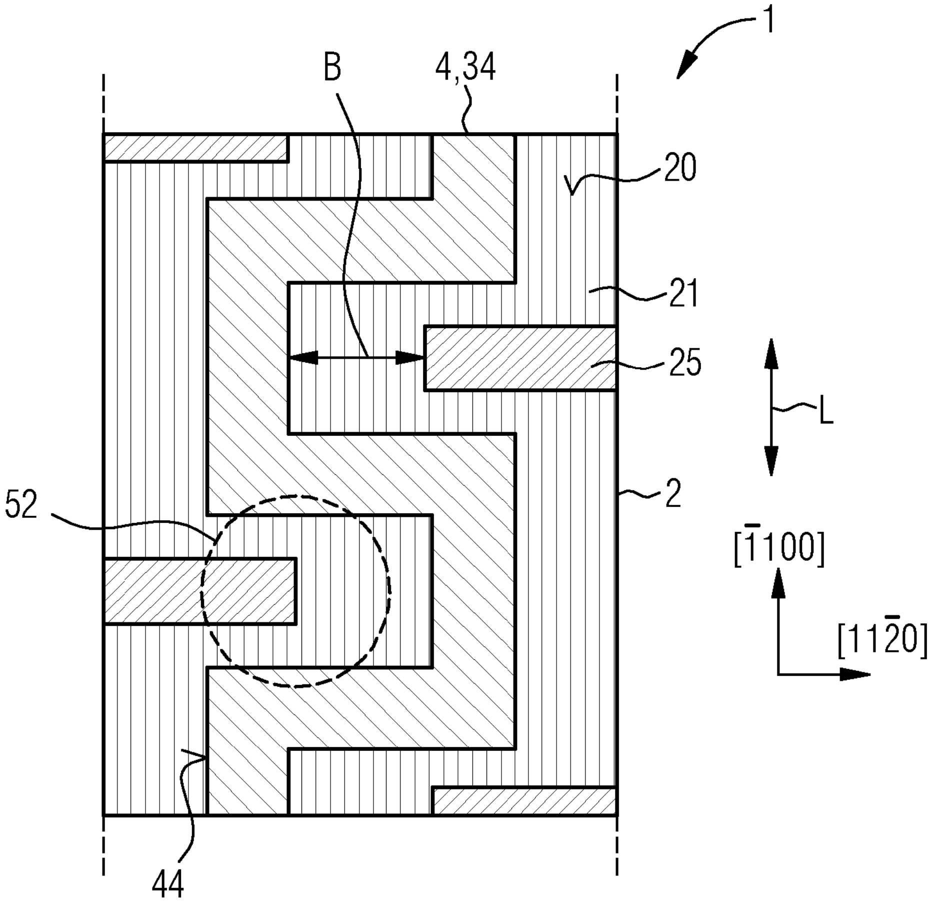

Otherwise, the same as to FIGS. 1 to 12 may also apply for FIG. 13.

Figure 14:
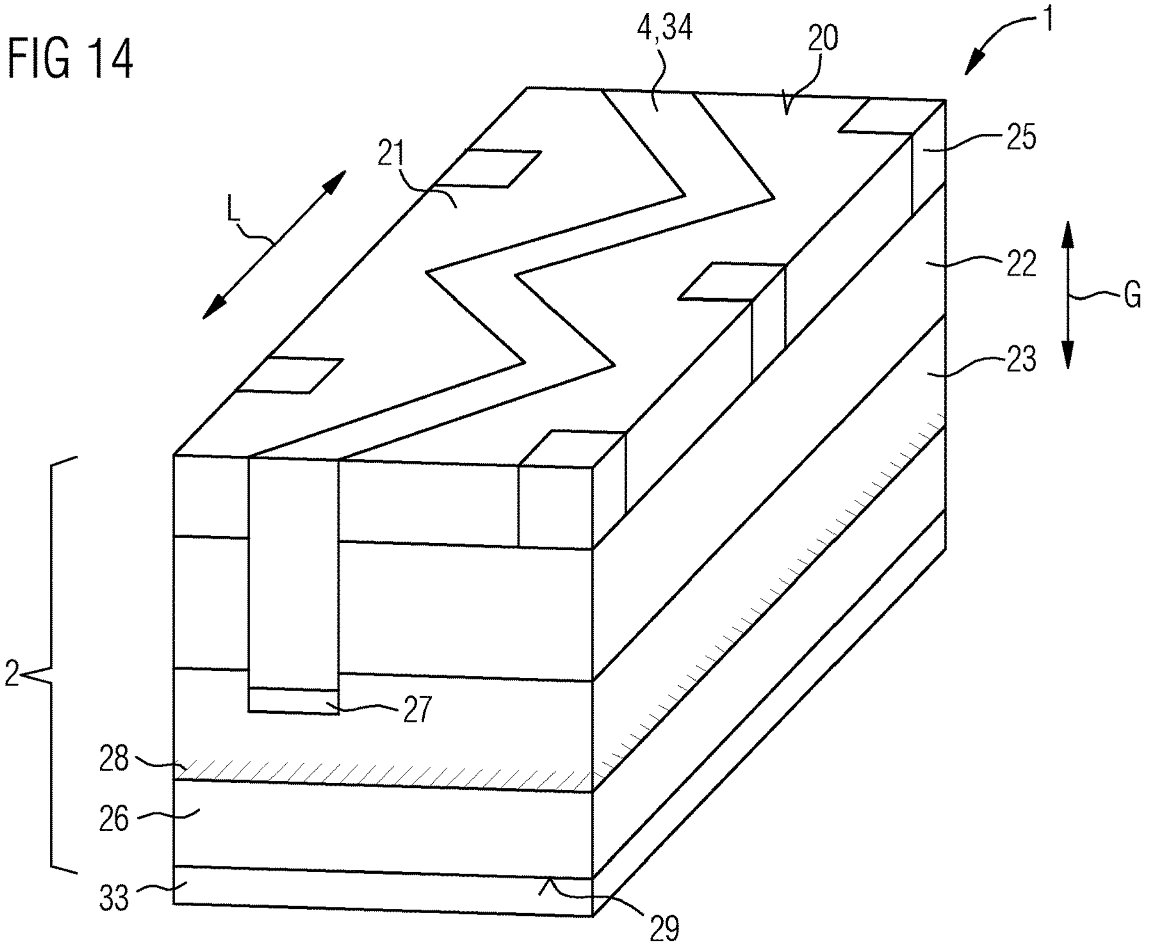
FIG. 14 is a schematic perspective view of an exemplary embodiment of a power semiconductor device described herein.

The power semiconductor devices 1 of FIGS. 1 to 4 and 6 to 13 are configured as trench MISFETs or MOSFETs. Contrary to that, the power semiconductor device 1 of FIG. 14 is an IGBT. Otherwise, all the power semiconductor devices 1 of FIGS. 1 to 4 and 6 to 13 can also be IGBTs, and the power semiconductor device 1 of FIG. 14 can be a trench MISFET or MOSFET.

Thus, according to FIG. 14, the power semiconductor device 1 comprises a collector region 26 in the semiconductor body 2 at the bottom side 29, and there is a collector electrode 33 at the collector region 26. If the drift region 23 is n-doped, then the collector region 26 is p-doped, and vice versa. For example, for a maximum doping concentration of the collector region 26 the same may apply as for the at least one channel region 22. As an option, there can be a buffer region 28 of the first conductivity type between the collector region 26 and the drift region 23. Such a buffer has a higher maximum doping concentration than the drift region 23, for example.

Further, in FIG. 14 it is illustrated that the trench 4 is of saw tooth like fashion, seen in top view. As in FIG. 13, there is no straight line solely running within the trench 4 and connecting opposite ends of the trench 4 along the direction L.

According to FIG. 14, seen in top view, the trench 4 has tips pointing away from a center axis of the trench 4 along the direction L. Other than shown, these tips may be rounded, or may be replaced by section running in parallel with the direction L. These modifications are analogously also possible in all other exemplary embodiments.

Like in the embodiments in FIGS. 6 to 13, in FIG. 14 the optional plugs 25 may be distant from the trench 4, or may otherwise be in contact with the trench 4.

Otherwise, the same as to FIGS. 1 to 13 may also apply for FIG. 14.

Figure 15:
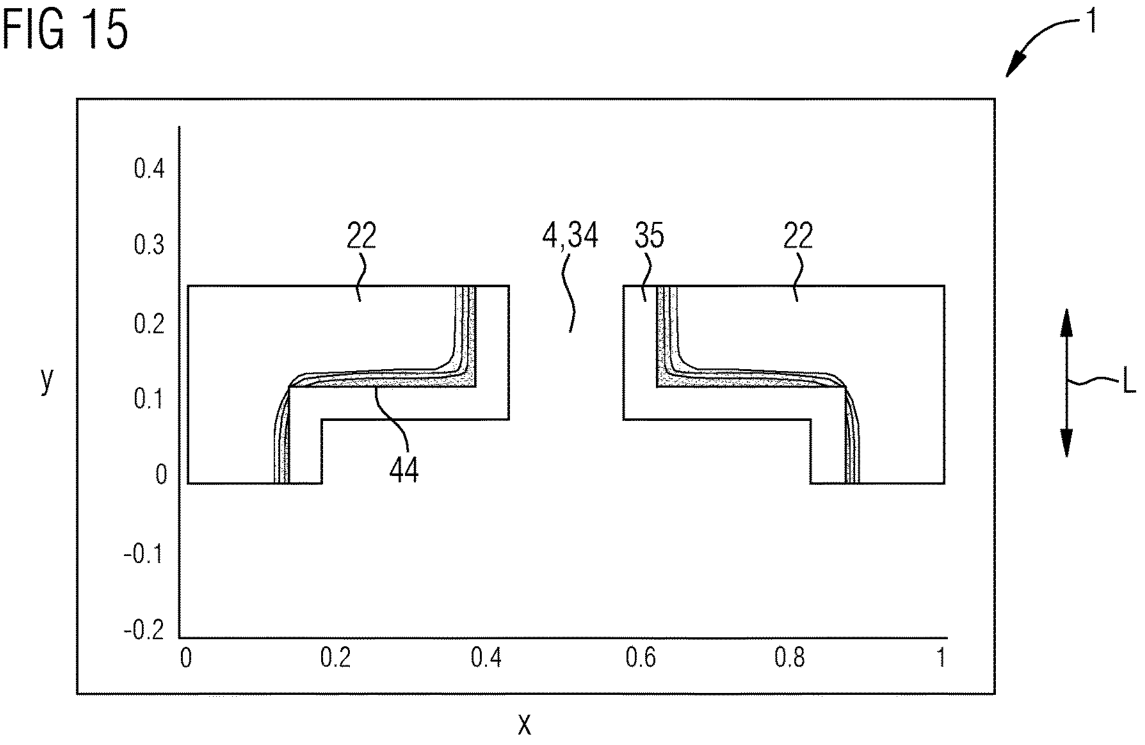
FIG. 15 is a schematic representation of simulated current density data for power semiconductor device described herein.

FIG. 15 shows simulation data to prove the advantages of the proposed trench design, in top view of the top side 20 and, thus, in an x-y plane. Only a slice of the basic unit has been simulated as depicted in FIG. 15. Although simulations show different effects in current conduction at the corners of the trench due to thicker or thinner oxide in those locations, the output characteristics in FIG. 15 indicates that the overall effect leads to a reduction of $R_{ON}$. In practice, the corners of the trench are usually rounded in order to minimize the crowding of electric field lines at the sharp points, and the side walls 44 may also have various angles, compare, for example, FIGS. 8 to 12 and 14.

Figure 16:
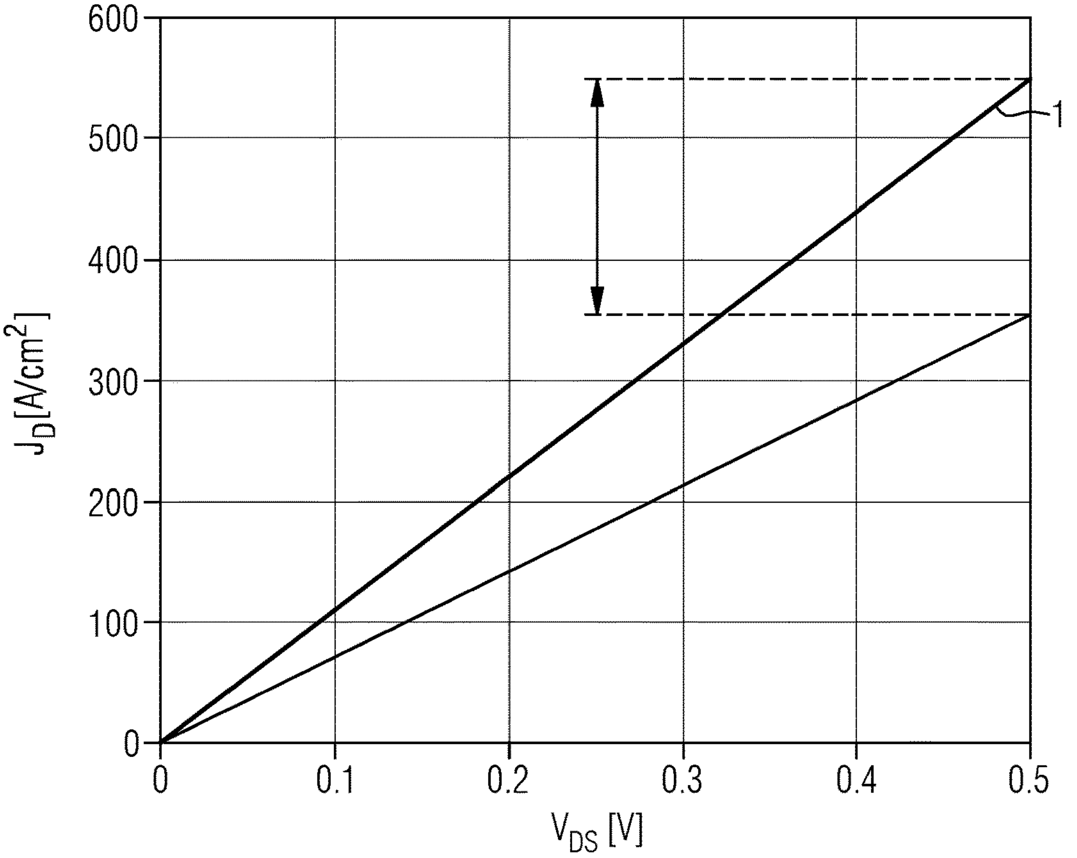
FIG. 16 is a schematic representation of simulated I-V curves for power semiconductor device described herein.

In FIG. 16, a comparison of output I-V curves at a gate-source voltage of 15 V between the power semiconductor device 1 described herein and a device having only a stripe-like trench structure. The resulting drain current vs. source-drain voltage curves at the gate-source voltage of 15V allow to evaluate a reduction of approximately 36% in an on-resistance $R_{ON}$ for the herein described step-like design as illustrated, for example, in FIG. 6.

Figure 17:
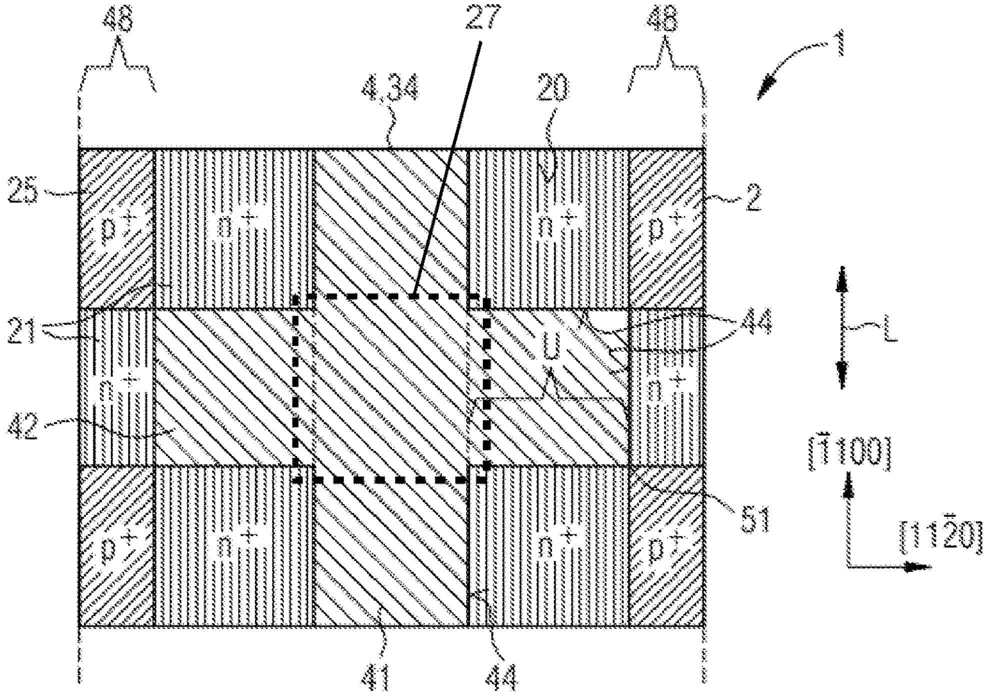
FIGS. 17 to 19 are schematic top views of exemplary embodiments of power semiconductor devices described herein.
Figure 18:
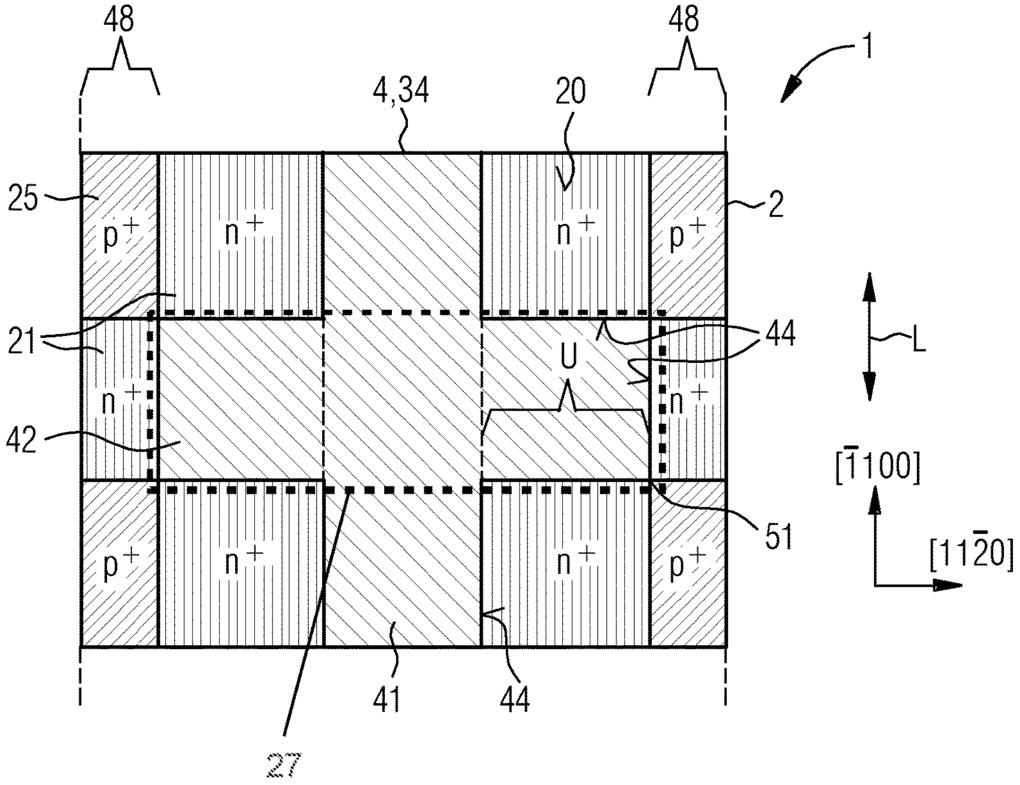
Figure 19:
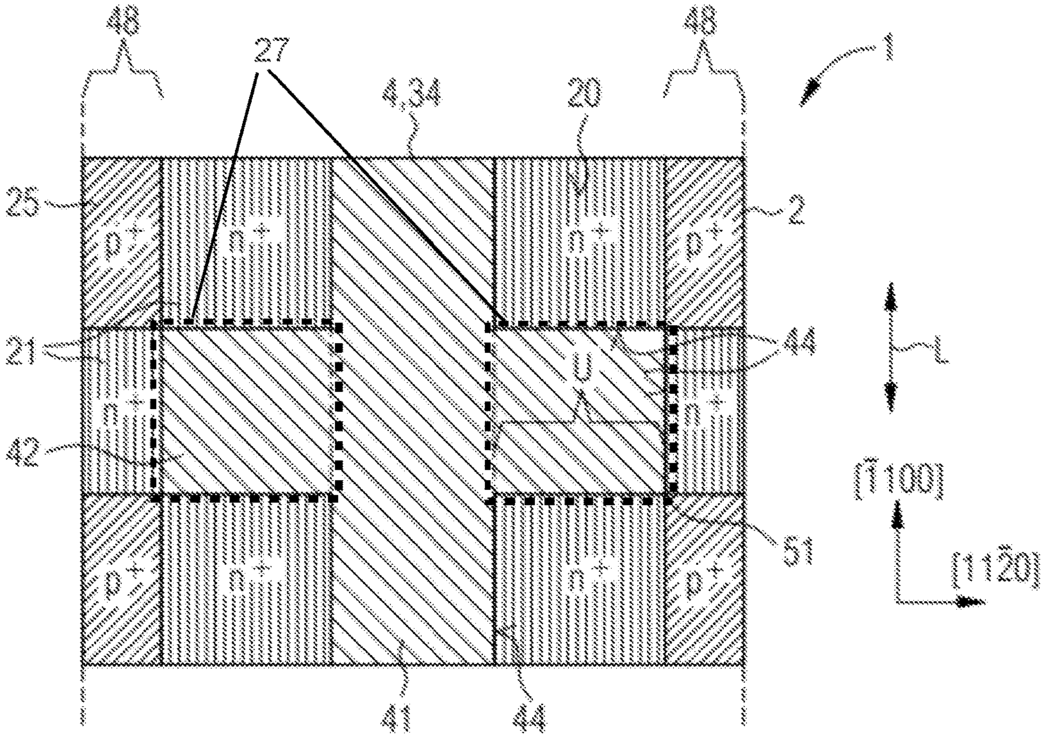

In the examples of FIGS. 17 to 19, there is the shield region 27 below part of the trench 4. In FIGS. 17 to 19, the branch-offs 42 are of rectangular shape, seen in top view, and are exactly opposite one another on pairs along the central pipe 41, but likewise the branch-offs 42 can be of trapezoidal shape as in FIGS. 8 to 10. Further, the source regions 21 and the plugs 25 can also be shaped like in FIG. 7 or 9. Opposite ones of the branch-offs 42 can optionally be displaced along the central pipe 41 relative to one another, for example, for at most 20% or for at most 40% of an extent of the respective branch-offs 42 along the central pipe 41.

The function of the shield region 27 is to protect the bottom edges and corners of the trenches 4 from high electric field during blocking condition. When high voltage is applied between source and drain during blocking, a high value of the electric field tends to build up at the dielectric/semiconductor interface at the bottom of the trench 4, especially at the sharp corners and edges. The concentrated field at those points can lead to dielectric breakdown and device failure.

The layout that gives highest protection for the trench 4 would be having the shield region 27 covering the entire bottom of the central pipe 41 as well as of the branch-offs 42, not shown, but it has the disadvantage during conduction as it creates large depletion regions around the vertical channel, that is, along the trench wall 44, potentially causing high JFET effect and constraining the current flow, that is, increasing the total on-state resistance.

To minimize this effect, other layouts are possible where the area of the shield region 27 below the trench 4 is reduced. One possibility is to limit the extension of the shield region 27 only to an intersection region between the central pipe 41 and the branch-offs 42, see FIG. 17. In this case, the effects on the on-state resistance at the trench walls 44 are minimized, and the rest of the trenches 4 could still be protected, for example, if the parameters as doping, dimensions and os on are properly chosen by the effect of the depletion region generated by different adjacent shield regions 27 which are formed like separate islands.

According to FIG. 18, the shield region 27 is formed as a bar below a pair of opposite branch-offs 42 and the part of the central pipe 41 between said branch-offs 42. That is, a plurality of said bars can follow one another along the central pipe 41.

In FIG. 19, the shield region 27 is also island-like, and the shield region 27 is limited to the branch-offs 42.

In other designs, not shown, the trench 4 may entirely provided with the shield region 27, or the shield region 27 could be limited to the central pipe 41, seen in top view of the top side 20.

The shield region 27 can be realized by proper masking and implantation and/or by an epi-implantation-epi process.

The device described here is not restricted by the description given with reference to the exemplary embodiments. Rather, the device encompasses any novel feature and any combination of features, including in particular any combination of features in the claims, even if this feature or this combination is not itself explicitly indicated in the claims or exemplary embodiments.

This patent application claims the priority of European patent application 2116 3959.6, the disclosure content of which is hereby incorporated by reference.

LIST OF REFERENCE SIGNS

1 power semiconductor device
2 semiconductor body
20 top side
21 source region
22 channel region
23 drift region
24 drain region
25 plug
26 collector region
27 shield region
28 buffer region
29 bottom side
31 source as well as channel region electrode
32 drain electrode
33 collector electrode
34 gate electrode
35 gate insulator
4 trench
41 central pipe
42 branch-off
44 side wall of the trench
46 trench bottom
48 strip
51 contact point
52 overlap region
A angle
B inner leg length
G growth direction
L direction of longest extent of the trench
U minimum size of a structural unit
x,y coordinate

The invention claimed is:

1. A power semiconductor device comprising:
- a semiconductor body;
- a source region of a first conductivity type disposed at a top side of the semiconductor body;
- a channel region of a second conductivity type disposed in the semiconductor body below the source region;
- a drift region of the first conductivity type disposed in the semiconductor body below the channel region;
- a trench extending from the top side through the source region and through the channel region and ending in the drift region, wherein, as seen in a top view of the top side, the trench comprises a central pipe and a plurality of branch-offs extending away from the central pipe;

a plurality of plugs of the second conductivity type extending from the top side to the channel region, each of the plugs spaced from the central pipe by a portion of the source region;

a gate electrode disposed within the trench; and a shield region of the second conductivity type located at least partially below a branch-off of the trench.

2. The power semiconductor device according to claim 1, wherein, as seen in the top view of the top side, the central pipe runs in a straight direction.

3. The power semiconductor device according to claim 1, wherein at least some of the branch-offs are of a trapezoidal shape as seen in the top view of the top side, the branch-offs of the trapezoidal shape widening in a direction away from the central pipe as seen in the top view of the top side.

4. The power semiconductor device according to claim 1, wherein at least some of the branch-offs are of a trapezoidal shape as seen in the top view of the top side, the branch-offs of the trapezoidal shape narrowing in a direction away from the central pipe as seen in the top view of the top side.

5. The power semiconductor device according to claim 1, wherein at least some of the branch-offs are of trigonal shape or of square shape or of rectangular shape as seen in the top view of the top side.

6. The power semiconductor device according to claim 1, wherein the shield region is limited to the branch-offs so that at least 90% of an area of the central pipe is free of the shield region as seen in the top view of the top side.

7. The power semiconductor device according to claim 1, wherein the shield region is limited to intersection regions of the branch-offs and the central pipe as seen in the top view of the top side, so that the shield region is below at most 20% of side walls of the trench.

8. The power semiconductor device according to claim 1, wherein the semiconductor body comprises a silicon carbide body and a direction of main extent of the trench runs along a [1100]-direction of the silicon carbide, and wherein a side wall of the trench comprises a portion next to the source region running transversely to the [1100]-direction of the silicon carbide.

9. The power semiconductor device according to claim 1, wherein, as seen in the top view of the top side, an overall length of side walls of the central pipe and the branch-offs exceeds a length of the central pipe by at least a factor of 1.2.

10. The power semiconductor device according to claim 1, wherein, with a tolerance of at most 15°, side walls of the trench are oriented perpendicular to the top side and a trench bottom runs in parallel with the top side.

11. The power semiconductor device according to claim 1, wherein each side wall of the trench comprises a plurality of the branch-offs.

12. The power semiconductor device according to claim 1, wherein, as seen in the top view of the top side, the trench has a portion with a meander shape so that the trench is free of a straight connection line between opposite ends of the trench completely running in or on top of the trench.

13. The power semiconductor device according to claim 12, wherein, as seen in the top view of the top side, the portion of the trench has a zigzag shape, a sinusoidal shape, or a square wave shape.

14. The power semiconductor device according to claim 1, wherein, as seen in the top view of the top side, the device includes straight strips next to the trench, the trench being located between two adjacent straight strips, wherein portions of the source region and the plugs are arranged in the straight strips in an alternating manner.

15. The power semiconductor device according to claim 1, wherein the device comprises a plurality of the trenches and a plurality of the source regions and wherein, as seen in the top view of the top side, the trenches and associated source regions are arranged in an alternating manner in a direction transverse to the trenches.

16. The power semiconductor device according to claim 1, wherein the device comprises a plurality of the trenches and a plurality of the source regions and wherein the power semiconductor device is a field-effect transistor or an insulated gate bipolar transistor.

17. A power semiconductor device comprising:

a semiconductor body;

a source region of a first conductivity type disposed at a top side of the semiconductor body;

a channel region of a second conductivity type in the semiconductor body below the source region;

a drift region of the first conductivity type in the semiconductor body below the channel region;

a trench extending from the top side through the source region and through the channel region and ending in the drift region, wherein, as seen in a top view of the top side, the trench comprises a central pipe running in a straight direction and a plurality of branch-offs branching from the central pipe;

a gate electrode disposed within the trench; and a shield region of the second conductivity type located at least at a depth of the semiconductor body from the top side that is greater than a depth of the trench, wherein the shield region is limited to the branch-offs so that at least 90% of an area of the central pipe is free of the shield region as seen in the top view of the top side.

18. The power semiconductor device according to claim 17, wherein at least some of the branch-offs are of a trapezoidal shape as seen in the top view of the top side.

19. The power semiconductor device according to claim 17, wherein, as seen in the top view of the top side, an overall length of each side wall of the central pipe and branch-offs exceeds a length of the central pipe by at least a factor of 1.4.

20. A power semiconductor device comprising:

a semiconductor body;

a source region of a first conductivity type in the semiconductor body at a top side thereof;

a channel region of a second conductivity type in the semiconductor body below the source region;

a plurality of plugs of the second conductivity type in the semiconductor body at the top side of the semiconductor body, the plugs providing electric contact paths from the top side to the channel region;

a drift region of the first conductivity type in the semiconductor body below the channel region;

a trench running from the top side through the source region and through the channel region and ending in the drift region;

a shield region which is of the second conductivity type and which is located below at least a part of a bottom side of the trench; and a gate electrode located in the trench and electrically separated from the semiconductor body by a gate insulator;

wherein, as seen in a top view of the top side, the trench comprises non-linearly running side walls;

wherein, as seen in the top view of the top side, the trench comprises a central pipe running straightly and a plurality of branch-offs branching from the central pipe;

wherein the shield region extends at least partially below at least one of the branch-offs, the shield region being limited to the branch-offs so that at least 90% of an area of the central pipe is free of the shield region, as seen in the top view of the top side;

wherein, as seen in the top view of the top side, straight strips are disposed next to the trench so that the trench is located between two adjacent straight strips;

wherein portions of the source region and the plugs are arranged in an alternating manner in the straight strips;

wherein the portions of the source region are disposed at front ends of the branch-offs so that at corners of the branch-offs close to the strips, the plugs touch the trench, or portions of the source region between adjacent branch-offs merge with the portions of the source region in the strips so that one continuous source region per side wall is provided;

wherein areas between adjacent branch-offs are composed of the source region; and wherein the branch-offs are provided on both sides of the central pipe, so that each side wall comprises a plurality of branch-offs.

* * * * *